United States Patent
Huang et al.

(10) Patent No.: US 11,063,611 B2
(45) Date of Patent: Jul. 13, 2021

(54) ENCODING METHOD AND APPARATUS

(71) Applicant: Huawei Technologies Co., Ltd., Shenzhen (CN)

(72) Inventors: Lingchen Huang, Hangzhou (CN); Huazi Zhang, Hangzhou (CN); Rong Li, Hangzhou (CN); Gongzheng Zhang, Hangzhou (CN); Chen Xu, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/673,118

(22) Filed: Nov. 4, 2019

(65) Prior Publication Data
US 2020/0067534 A1    Feb. 27, 2020

Related U.S. Application Data

(63) Continuation of application No. PCT/CN2018/085503, filed on May 3, 2018.

(30) Foreign Application Priority Data

May 5, 2017   (CN) .......................... 201710314164.5

(51) Int. Cl.
| | |
|---|---|
| *H03M 13/27* | (2006.01) |
| *H03M 13/09* | (2006.01) |
| *H03M 13/11* | (2006.01) |
| *H03M 13/15* | (2006.01) |
| *H04L 1/00* | (2006.01) |

(52) U.S. Cl.
CPC ....... *H03M 13/271* (2013.01); *H03M 13/091* (2013.01); *H03M 13/1102* (2013.01);
(Continued)

(58) Field of Classification Search
CPC ................................................ G03M 13/271
(Continued)

(56) References Cited

U.S. PATENT DOCUMENTS

| | | | |
|---|---|---|---|
| 2010/0293433 A1 | 11/2010 | Limberg | |
| 2013/0145239 A1 | 6/2013 | Pi et al. | |

(Continued)

FOREIGN PATENT DOCUMENTS

| | | |
|---|---|---|
| CN | 101636938 A | 1/2010 |
| CN | 104219019 A | 12/2014 |

(Continued)

OTHER PUBLICATIONS

Ericsson, "Design of CRC-assisted Polar Code", 3GPP TSG-RAN WG1 #88, R1-1701630, Feb. 13-17, 2017, 7 Pages, Athens, Greece.
(Continued)

*Primary Examiner* — Fritz Alphonse
(74) *Attorney, Agent, or Firm* — Slater Matsil, LLP

(57) ABSTRACT

An encoding method and apparatus are provided. The method by a transmit end includes: performing check encoding on to-be-encoded information to obtain a check encoding codeword that comprises K information bits and J check bits; performing an interleaving operation on the check encoding codeword with an interleaving sequence including J subsequences, and an $i^{th}$ subsequence includes a position index of an element 1 in an intermediate result vector $T_i$ and a value of (K+i), where $1 \le i \le J$, i is an integer, $T_i = (\sim M) \& (V_i)$, $M = M|(V_i)$, M is a masked vector, $V_i$ is a column vector of a checking part matrix P, P is a submatrix of a generator matrix G for check encoding, ~ represents a bit-by-bit NOT operation, & represents a bit-by-bit AND operation, and | represents a bit-by-bit OR operation; and performing polar encoding on a check encoding codeword obtained after the interleaving operation.

20 Claims, 7 Drawing Sheets

(52) U.S. Cl.
CPC ..... *H03M 13/152* (2013.01); *H03M 13/2778* (2013.01); *H03M 13/2792* (2013.01); *H04L 1/0041* (2013.01); *H04L 1/0071* (2013.01)

(58) Field of Classification Search
USPC ........................................................ 714/776
See application file for complete search history.

(56) References Cited

U.S. PATENT DOCUMENTS

| | | | |
|---|---|---|---|
| 2014/0208183 A1 | 7/2014 | Mandavifar et al. | |
| 2018/0123849 A1* | 5/2018 | Si | H04J 11/0073 |
| 2018/0309611 A1* | 10/2018 | Ko | H04W 56/001 |
| 2019/0268025 A1 | 8/2019 | Shen et al. | |
| 2020/0244287 A1* | 7/2020 | Xu | H03M 13/1188 |

FOREIGN PATENT DOCUMENTS

| | | | |
|---|---|---|---|
| CN | 104539393 A | 4/2015 |
| CN | 105656604 A | 6/2016 |
| CN | 106452460 A | 2/2017 |
| EP | 2518922 A1 | 10/2012 |

OTHER PUBLICATIONS

Nokia, et al., "Details of CRC distribution of Polar design", 3GPP TSG-RAN WG1 Meeting #88, R1-1703497, Feb. 13-17, 2017, 9 Pages, Athens, Greece.

\* cited by examiner

ENCODING METHOD AND APPARATUS

CROSS-REFERENCE TO RELATED APPLICATIONS

This application is a continuation of International Patent Application No. PCT/CN2018/085503 filed on May 3, 2018, which claims priority to Chinese Patent Application No. 201710314164.5, filed on May 5, 2017. The disclosures of the aforementioned applications are hereby incorporated by reference in their entireties.

TECHNICAL FIELD

Embodiments of this application relate to the field of communications technologies, and in particular, to an encoding method and apparatus.

BACKGROUND

A cyclic redundancy check (CRC) code is a most common error-detecting code in the field of data communication, and a feature of the CRC code is that a length of an information field and a length of a check field may be randomly selected. In a communications system, a CRC code is used to detect whether data is correctly transmitted, and control an occurrence probability of a false alarm.

An implementation of CRC encoding is in a form of a shift register. FIG. 1 shows a common manner of implementing CRC encoding in a form of a shift register (which is briefly referred to as a register). A feedback tap of the register is determined based on a CRC polynomial [1 0 1 0 1], and content of the register is initialized to a preset value. During encoding, bits of to-be-encoded information are shifted into a register from one side one by one. A bit exclusive OR operation is performed between a feedback tap and a corresponding register status, so that the register status changes. After all to-be-encoded bits are shifted into the register, bits 0 of a same bit quantity as that of CRC check bits are shifted into the register, and then a register status is read. The register status is used as a CRC check bit, and is attached after the to-be-encoded information to form a CRC encoding codeword. A transmit end performs channel encoding on a CRC code, and a receive end performs corresponding channel decoding. After channel decoding ends, a CRC check is performed to determine, based on a decoding result, whether decoding succeeds.

However, in a sequential decoding (namely, serial decoding) manner, if the foregoing conventional CRC encoding manner is used, the CRC check can be performed only after channel decoding ends. This leads to a complex decoding process, a relatively long occupation time, and a waste of decoding resources.

SUMMARY

Embodiments of this application provide an encoding method and apparatus, to resolve a problem of a waste of decoding resources caused because a decoding process is complex due to use of a prior-art CRC encoding manner.

Specific technical solutions provided in the embodiments of this application are as follows.

According to a first aspect, an encoding method is provided. A transmit end intersperses a check bit of to-be-encoded information between information bits in an interleaving manner. When a receive end performs sequential decoding, each time a check bit is obtained through decoding, a check can be performed based on the decoded check bit, and if the check fails, decoding may end in advance. This helps to avoid a problem of a waste of decoding resources caused because a check is performed after channel decoding ends, to shorten decoding duration and improve decoding efficiency.

In a possible design, the transmit end performs check encoding on to-be-encoded information to obtain a check encoding codeword, where the check encoding codeword includes an information bit and a check bit, a length of the information bit is K, and a length of the check bit is J; the transmit end performs an interleaving operation on the check encoding codeword, where an interleaving sequence S used in the interleaving operation includes J subsequences, and an $i^{th}$ subsequence includes a position index of an element 1 in an intermediate result vector $T_i$ and a value of (K+i), where $1 \le i \le J$, i is an integer, $T_i=(\sim M)\&(V_i)$, $M=M|(V_i)$, M is a masked vector, $V_i$ is a column vector of a checking part matrix P, P is a submatrix of a system-form generator matrix G for check encoding, ~ represents a bit-by-bit NOT operation, & represents a bit-by-bit AND operation, and | represents a bit-by-bit OR operation; and the transmit end performs polar encoding on a check encoding codeword obtained after the interleaving operation. Optionally, both $T_i$ and M are 1×K vectors.

Optionally, when the encoding method is implemented by hardware, the intermediate result vector $T_i$ may occupy a section of address-continuous storage space.

It can be learned that, a manner of calculating an interleaving sequence is simpler, and is easier to implement, effectively reducing hardware overheads, and helping to increase encoding resource utilization.

In a possible design, the transmit end obtains the interleaving sequence S through dynamic calculation or offline storage. Specifically, before performing the interleaving operation on the check encoding codeword, the transmit end calculates the interleaving sequence S, or the transmit end performs offline calculation and storage of the interleaving sequences S. When the transmit end performs the interleaving operation on the check encoding codeword, the transmit end performs the interleaving operation on the check encoding codeword based on the stored interleaving sequence S.

In a possible design, values of i in the J subsequences may be assigned in the following order: an ascending order of values of i; a descending order of values of i; an ascending order of quantities of elements 1 in column vectors $V_i$; or a descending order of quantities of elements 1 in column vectors $V_i$.

According to a second aspect, an encoding method is provided. A transmit end performs check encoding on to-be-encoded information to obtain a check encoding codeword, where the check encoding codeword includes an information bit and a check bit, a length of the information bit is K, and a length of the check bit is J; the transmit end performs an interleaving operation on the check encoding codeword; and the transmit end performs polar encoding on a check encoding codeword obtained after the interleaving operation. An interleaving sequence S used in the interleaving operation is obtained in the following manners: calculating a generator matrix G for check encoding, and extracting a checking part matrix P from the generator matrix G; initializing a masked vector M, an intermediate result vector $T_i$, and an interleaving sequence S; reading column vectors $V_i$ of the checking part matrix P column by column in a specified order, where each time a column vector $V_i$ is read, the following operations are performed: performing calculation of $T_i=(\sim M)\&(V_i)$, recording, at a tail part of S, an index value of an element 1 in $T_i$ and a value of (K+i) sequentially, where i is a column index value of $V_i$ in P, and updating M according to $M=M|(V_i)$. In this case, when a receive end performs sequential decoding, each time a check bit is obtained through decoding, a check can be performed based on the decoded check bit, and if the check fails, decoding may end in advance, helping to avoid a problem of a waste of decoding resources caused because a check is performed after channel decoding ends, to shorten decoding duration and improve decoding efficiency.

Optionally, both $T_i$ and M are 1×K vectors.

Optionally, when the encoding method is implemented by hardware, the intermediate result vector $T_i$ may occupy a section of address-continuous storage space.

It can be learned that, a manner of calculating an interleaving sequence is simpler, and is easier to implement, effectively reducing hardware overheads, and helping to increase encoding resource utilization.

In a possible design, the reading column vectors $V_i$ of the checking part matrix column P by column in a specified order is implemented in the following manners: reading the column vectors $V_i$ of the checking part matrix P column by column in ascending order of column index values; or reading the column vectors $V_i$ of the checking part matrix P column by column in descending order of column index values.

According to a third aspect, an encoding method is provided. A transmit end performs offline calculation of an interleaving sequence S offline in the following manners: calculating a generator matrix G for check encoding, and extracting a checking part matrix P from the generator matrix G; initializing a masked vector M, an intermediate result vector $T_i$, and the interleaving sequence S; reading column vectors $V_i$ of the checking part matrix P column by column in a specified order, where each time a column vector $V_i$ is read, the following operations are performed: performing calculation of $T_i=(\sim M)\&(V_i)$, recording, at a tail part of S, an index value of an element 1 in $T_i$ and a value of (K+i) sequentially, where i is a column index value of $V_i$ in P, and updating M according to $M=M|(V_i)$. The transmit end stores the interleaving sequence S; after obtaining to-be-encoded information, the transmit end performs check encoding on the to-be-encoded information to obtain a check encoding codeword, and performs an interleaving operation on the check encoding codeword by using the stored interleaving sequence S; and the transmit end performs polar encoding on a check encoding codeword obtained after the interleaving operation. In this case, when a receive end performs sequential decoding, each time a check bit is obtained through decoding, a check can be performed based on the decoded check bit, and if the check fails, decoding may end in advance, helping to avoid a problem of a waste of decoding resources caused because a check is performed after channel decoding ends, to shorten decoding duration and improve decoding efficiency.

Optionally, both $T_i$ and M are 1×K vectors.

Optionally, when the encoding method is implemented by hardware, the intermediate result vector $T_i$ may occupy a section of address-continuous storage space.

It can be learned that, a manner of calculating an interleaving sequence is simpler, and is easier to implement, effectively reducing hardware overheads, and helping to increase encoding resource utilization.

In a possible design, the reading column vectors $V_i$ of the checking part matrix P column by column in a specified order is implemented in the following manners: reading the column vectors $V_i$ of the checking part matrix P column by column in ascending order of column index values; or reading the column vectors $V_i$ of the checking part matrix P column by column in descending order of column index values.

According to a fourth aspect, an encoding method is provided. A transmit end obtains a to-be-encoded information vector U; the transmit end calculates a system-form generator matrix G for check encoding, and extracts a checking part matrix P from G; the transmit end initializes a masked vector M, a first intermediate result vector $T1_i$, a second intermediate result vector $T2_i$, and a check encoding codeword C; the transmit end reads column vectors $V_i$ of the checking part matrix P column by column in a specified order, where each time a column vector $V_i$ is read, the following operations are performed: performing calculation of $T_i=(\sim M)\&(V_i)$; performing a bit-by-bit AND operation between U and $V_i$ to obtain $T2_i$; determining a position index of an element 1 in $T1_i$, and recording, at a tail part of C, a result of an exclusive OR operation between an element corresponding to the position index in $T2_i$ and all elements in $T2_i$; and updating M according to $M=M|(V_i)$, where $\sim$ represents a bit-by-bit NOT operation; & represents a bit-by-bit AND operation; and | represents a bit-by-bit OR operation; and the transmit end performs polar encoding on the check encoding codeword C. In this case, when a receive end performs sequential decoding, each time a check bit is obtained through decoding, a check can be performed based on the decoded check bit, and if the check fails, decoding may end in advance, helping to avoid a problem of a waste of decoding resources caused because a check is performed after channel decoding ends, to shorten decoding duration and improve decoding efficiency.

In a possible design, that the transmit end reads column vectors $V_i$ of the checking part matrix P column by column in a specified order is implemented in the following manners: reading, by the transmit end, the column vectors $V_i$ of the checking part matrix P column by column in ascending order of column index values; reading, by the transmit end, the column vectors $V_i$ of the checking part matrix P column by column in descending order of column index values; reading, by the transmit end, the column vectors $V_i$ of the checking part matrix P column by column in ascending order of quantities of elements 1 in column vectors; or reading, by the transmit end, the column vector $V_i$ of the checking part matrix P column by column in descending order of quantities of elements 1 in column vectors.

According to a fifth aspect, a decoding method is provided. A receive end obtains a to-be-decoded sequence; and the receive end performs polar code decoding on the to-be-decoded sequence, and performs a de-interleaving operation on a decoded sequence. Assuming that a length of an information bit is K, a length of a check bit is J, a de-interleaving sequence S' used in the interleaving operation meets S'(S(j))=j, where 1≤j≤(K+J), j is an integer, and S is an interleaving sequence; the interleaving sequence S includes J subsequences, and the subsequence includes a position index of an element 1 in an intermediate result vector $T_i$ and a value of (K+i), where 1≤i≤J, i is an integer, $T_i=(\sim M)\&(V_i)$, $M=M|(V_i)$, M is a masked vector, $V_i$ is a column vector of a checking part matrix P, P is a submatrix of a system-form generator matrix G for check encoding, $\sim$ represents a bit-by-bit NOT operation, & represents a bit-by-bit AND operation, and | represents a bit-by-bit OR operation.

Optionally, both $T_i$ and M are 1×K vectors.

In a possible design, the receive end obtains the de-interleaving sequence S' through dynamic calculation or offline storage. Specifically, before performing the de-interleaving operation on the decoded sequence, the receive end calculates the de-interleaving sequence S', or the receive end performs offline calculation and storage of the de-interleaving sequences S'. When the receive end performs the de-interleaving operation on the decoded sequence, the receive end performs the de-interleaving operation on the decoded sequence based on the stored de-interleaving sequence S'.

In a possible design, values of i in the J subsequences may be assigned in the following order: an ascending order of values of i; a descending order of values of i; an ascending order of quantities of elements 1 in column vectors $V_i$; or a descending order of quantities of elements 1 in column vectors $V_i$.

According to a sixth aspect, a decoding method is provided. A receive end performs offline calculation of a de-interleaving sequence S' in the following manners: calculating a generator matrix G for check encoding; extracting a checking part matrix P from the generator matrix G; initializing a masked vector M, an intermediate result vector $T_i$, and an interleaving sequence S; reading column vectors $V_i$ of the checking part matrix P column by column in a specified order, where each time a column vector $V_i$ is read, the following operations are performed: performing calculation of $T_i=(\sim M)\&(V_i)$, recording, at a tail part of S, a position index of an element 1 in $T_i$ and a value of (K+i) sequentially, where i is a column index value of $V_i$ in P, and updating M according to $M=M|(V_i)$; and obtaining S' according to $S'(S(j))=j$, where $1 \leq j \leq (K+J)$, and j is an integer. The receive end stores the de-interleaving sequence S'; and after obtaining the to-be-decoded sequence, the receive end performs polar code decoding on the to-be-decoded sequence, and performs a de-interleaving operation on the decoded sequence by using the stored de-interleaving sequence S'.

In a possible design, the reading column vectors $V_i$ of the checking part matrix P column by column in a specified order is implemented in the following manners: reading the column vectors $V_i$ of the checking part matrix P column by column in ascending order of column index values; or reading the column vectors $V_i$ of the checking part matrix P column by column in descending order of column index values.

According to a seventh aspect, an encoding apparatus is provided. The apparatus has functions of implementing a behavior of the transmit end in the first aspect and any possible design of the first aspect. The functions may be implemented by hardware, or may be implemented by hardware by executing corresponding software. The hardware or the software includes one or more modules corresponding to the foregoing functions.

In a possible design, when some or all of the functions are implemented by hardware, the encoding apparatus includes: an input interface circuit, configured to obtain to-be-encoded information; a logic circuit, configured to perform the behavior of the transmit end in the first aspect and any possible design of the first aspect; and an output interface circuit, configured to output a bit sequence obtained after polar encoding.

Optionally, the encoding apparatus may be a chip or an integrated circuit.

In a possible design, when some or all of the functions are implemented by software, the encoding apparatus includes: a memory, configured to store a program; and a processor, configured to execute the program stored in the memory. When the program is executed, the encoding apparatus can implement the method according to the first aspect and any possible design of the first aspect.

Optionally, the memory may be a physically independent unit, or may be integrated together with the processor.

In a possible design, when some or all of the functions are implemented by software, the encoding apparatus includes a processor. A memory configured to store a program is located outside the encoding apparatus. The processor is connected to the memory through a circuit/an electric wire, and is configured to read and execute the program stored in the memory.

According to an eighth aspect, an encoding apparatus is provided. The apparatus has functions of implementing a behavior of the transmit end in the second aspect and any possible design of the second aspect. The functions may be implemented by hardware, or may be implemented by hardware by executing corresponding software. The hardware or the software includes one or more modules corresponding to the foregoing functions.

In a possible design, when some or all of the functions are implemented by hardware, the encoding apparatus includes: an input interface circuit, configured to obtain to-be-encoded information; a logic circuit, configured to perform the behavior of the transmit end in the second aspect and any possible design of the second aspect; and an output interface circuit, configured to output a bit sequence obtained after polar encoding.

Optionally, the encoding apparatus may be a chip or an integrated circuit.

In a possible design, when some or all of the functions are implemented by software, the encoding apparatus includes: a memory, configured to store a program; and a processor, configured to execute the program stored in the memory. When the program is executed, the encoding apparatus can implement the method according to the second aspect and any possible design of the second aspect.

Optionally, the memory may be a physically independent unit, or may be integrated together with the processor.

In a possible design, when some or all of the functions are implemented by software, the encoding apparatus includes a processor. A memory configured to store a program is located outside the encoding apparatus. The processor is connected to the memory through a circuit/an electric wire, and is configured to read and execute the program stored in the memory.

According to a ninth aspect, an encoding apparatus is provided. The apparatus has functions of implementing a behavior of the transmit end in the third aspect and any possible design of the third aspect. The functions may be implemented by hardware, or may be implemented by hardware by executing corresponding software. The hardware or the software includes one or more modules corresponding to the foregoing functions.

In a possible design, when some or all of the functions are implemented by hardware, the encoding apparatus includes: an input interface circuit, configured to obtain to-be-encoded information; a logic circuit, configured to perform the behavior of the transmit end in the third aspect and any possible design of the third aspect; and an output interface circuit, configured to output a bit sequence obtained after polar encoding.

Optionally, the encoding apparatus may be a chip or an integrated circuit.

In a possible design, when some or all of the functions are implemented by software, the encoding apparatus includes: a memory, configured to store a program; and a processor, configured to execute the program stored in the memory.

When the program is executed, the encoding apparatus can implement the method according to the third aspect and any possible design of the third aspect.

Optionally, the memory may be a physically independent unit, or may be integrated together with the processor.

In a possible design, when some or all of the functions are implemented by software, the encoding apparatus includes a processor. A memory configured to store a program is located outside the encoding apparatus. The processor is connected to the memory through a circuit/an electric wire, and is configured to read and execute the program stored in the memory.

According to a tenth aspect, an encoding apparatus is provided. The apparatus has functions of implementing a behavior of the transmit end in the fourth aspect and any possible design of the fourth aspect. The functions may be implemented by hardware, or may be implemented by hardware by executing corresponding software. The hardware or the software includes one or more modules corresponding to the foregoing functions.

In a possible design, when some or all of the functions are implemented by hardware, the encoding apparatus includes: an input interface circuit, configured to obtain a to-be-encoded information vector U; a logic circuit, configured to perform the behavior of the transmit end in the fourth aspect and any possible design of the fourth aspect; and an output interface circuit, configured to output a bit sequence obtained after polar encoding.

Optionally, the encoding apparatus may be a chip or an integrated circuit.

In a possible design, when some or all of the functions are implemented by software, the encoding apparatus includes: a memory, configured to store a program; and a processor, configured to execute the program stored in the memory. When the program is executed, the encoding apparatus can implement the method according to the fourth aspect and any possible design of the fourth aspect.

Optionally, the memory may be a physically independent unit, or may be integrated together with the processor.

In a possible design, when some or all of the functions are implemented by software, the encoding apparatus includes a processor. A memory configured to store a program is located outside the encoding apparatus. The processor is connected to the memory through a circuit/an electric wire, and is configured to read and execute the program stored in the memory.

According to an eleventh aspect, a decoding apparatus is provided. The apparatus has functions of implementing a behavior of the receive end in the fifth aspect and any possible design of the fifth aspect. The functions may be implemented by hardware, or may be implemented by hardware by executing corresponding software. The hardware or the software includes one or more modules corresponding to the foregoing functions.

In a possible design, when some or all of the functions are implemented by hardware, the decoding apparatus includes: an input interface circuit, configured to obtain a to-be-decoded sequence; a logic circuit, configured to perform the behavior of the receive end in the fifth aspect and any possible design of the fifth aspect; and an output interface circuit, configured to output a bit sequence obtained after a de-interleaving operation.

Optionally, the decoding apparatus may be a chip or an integrated circuit.

In a possible design, when some or all of the functions are implemented by software, the decoding apparatus includes: a memory, configured to store a program; and a processor, configured to execute the program stored in the memory. When the program is executed, the decoding apparatus can implement the method according to the fifth aspect and any possible design of the fifth aspect.

Optionally, the memory may be a physically independent unit, or may be integrated together with the processor.

In a possible design, when some or all of the functions are implemented by software, the decoding apparatus includes a processor. A memory configured to store a program is located outside the decoding apparatus. The processor is connected to the memory through a circuit/an electric wire, and is configured to read and execute the program stored in the memory.

According to a twelfth aspect, a decoding apparatus is provided. The apparatus has functions of implementing a behavior of the receive end in the sixth aspect and any possible design of the sixth aspect. The functions may be implemented by hardware, or may be implemented by hardware by executing corresponding software. The hardware or the software includes one or more modules corresponding to the foregoing functions.

In a possible design, when some or all of the functions are implemented by hardware, the decoding apparatus includes: an input interface circuit, configured to obtain a to-be-decoded sequence; a logic circuit, configured to perform the behavior of the receive end in the sixth aspect and any possible design of the sixth aspect; and an output interface circuit, configured to output a bit sequence obtained after a de-interleaving operation.

Optionally, the decoding apparatus may be a chip or an integrated circuit.

In a possible design, when some or all of the functions are implemented by software, the decoding apparatus includes: a memory, configured to store a program; and a processor, configured to execute the program stored in the memory. When the program is executed, the decoding apparatus can implement the method according to the fifth aspect and any possible design of the fifth aspect.

Optionally, the memory may be a physically independent unit, or may be integrated together with the processor.

In a possible design, when some or all of the functions are implemented by software, the decoding apparatus includes a processor. A memory configured to store a program is located outside the decoding apparatus. The processor is connected to the memory through a circuit/an electric wire, and is configured to read and execute the program stored in the memory.

According to a thirteenth aspect, a communications system is provided. The system includes the apparatuses according to any one of the seventh aspect to the tenth aspect, and the apparatus according to the eleventh aspect or the twelfth aspect.

According to a fourteenth aspect, a computer storage medium is provided. The computer storage medium is configured to store a computer program, where the computer program includes an instruction used to perform the methods according to the first aspect to the sixth aspect and any possible implementation of the first aspect to the sixth aspect.

According to a fifteenth aspect, a computer program product including an instruction is provided. When the computer program product runs on a computer, the computer is enabled to perform the methods described in the foregoing aspects.

DETAILED DESCRIPTION OF ILLUSTRATIVE EMBODIMENTS

The following describes in detail the embodiments of this application with reference to accompanying drawings.

The embodiments of this application provide an encoding method and apparatus. A check bit is interspersed between to-be-encoded information bits in an interleaving manner. When a receive end performs sequential decoding, each time a check bit is obtained through decoding, a check can be performed based on the decoded check bit, and if the check fails, decoding may end in advance, helping to avoid a problem of a waste of decoding resources caused because a check is performed after channel decoding ends, to shorten decoding duration and improve decoding efficiency.

Figure 1:
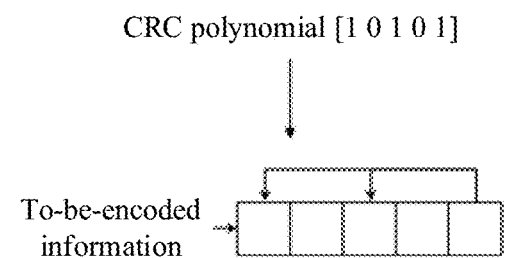
FIG. 1 is a schematic diagram of a CRC encoding manner in the prior art.
Figure 2:
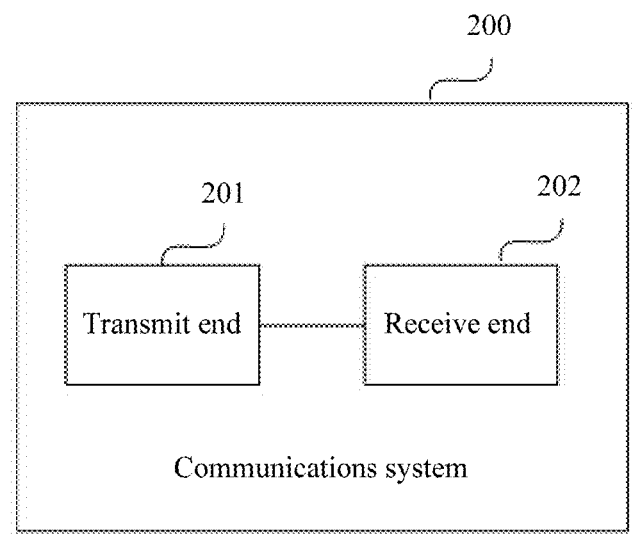
FIG. 2 is a schematic architectural diagram of a communications system according to an embodiment of this application.

As shown in FIG. 2, a communications system 200 applied in an embodiment of this application includes a transmit end 201 and a receive end 202. The transmit end 201 may be a base station, and the receive end 202 may be a terminal; or the transmit end 201 may be a terminal, and the receive end 202 may be a base station. The base station is an apparatus that is deployed in a radio access network and that is configured to provide a wireless communication function for the terminal. The base station may include a macro base station, a micro base station, a relay station, an access point, and the like in various forms. The base station may be applied to systems in which different radio access technologies are used, for example, a long term evolution (LTE) system, a 5th generation (5G) communications system, or more possible communications systems. The base station may alternatively be another network device with a base station function, particularly, a terminal with a base station function in D2D communication. The terminal may include various handheld devices, vehicle-mounted devices, wearable devices, or computing devices with a wireless communication function, or another processing device connected to a wireless modem, various forms of user equipment (UE), a mobile station (MS), and the like.

Based on an architecture of the communications system shown in FIG. 2, in this embodiment of this application, the transmit end 201 performs check encoding and polar encoding on to-be-encoded information. The transmit end 201 performs interleaving on a check encoding codeword, or the transmit end 201 intersperses a check bit between information bits in a check encoding process. The transmit end 201 sends a polar code codeword obtained after encoding to the receive end 202, and the receive end 202 performs encoding and de-interleaving.

Figure 3:
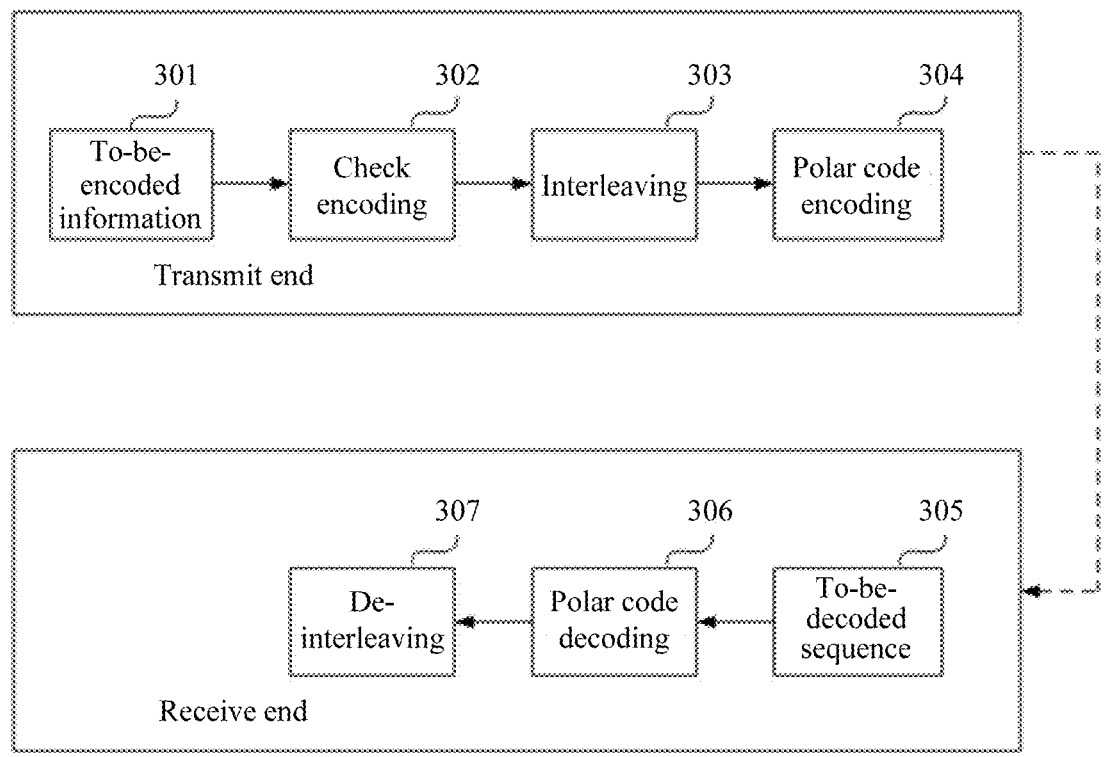
FIG. 3 is a schematic flowchart 1 of an encoding method according to an embodiment of this application.
Figure 4:
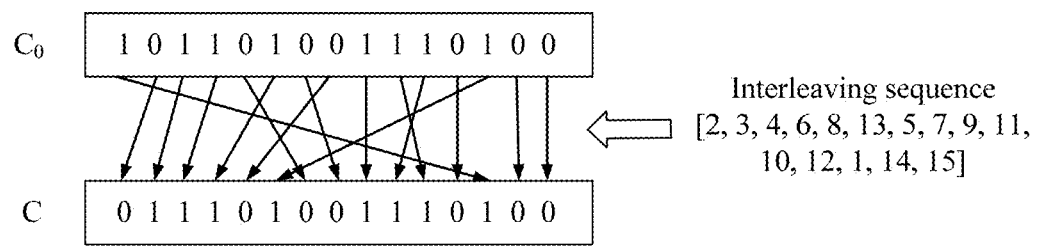
FIG. 4 is a schematic diagram of interleaving of a check encoding codeword according to an embodiment of this application.
Figure 5:
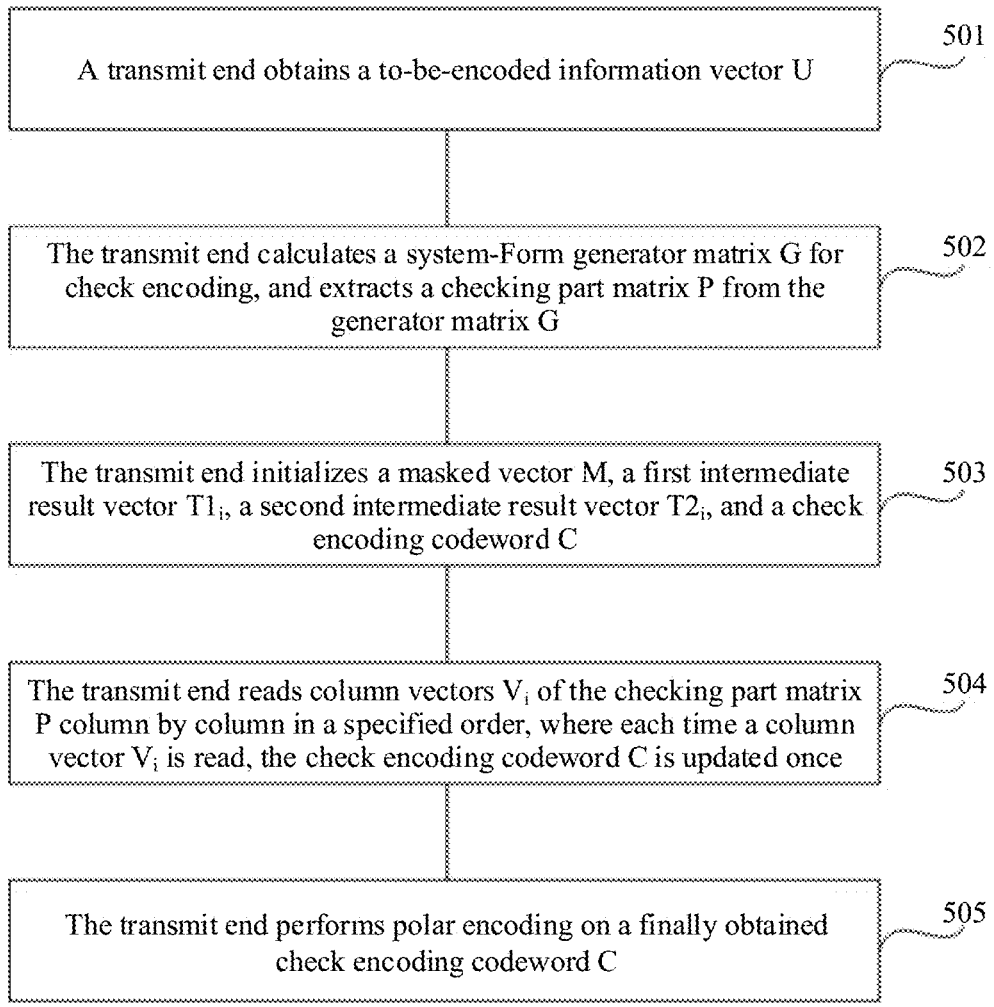
FIG. 5 is a schematic flowchart 2 of an encoding method according to an embodiment of this application.

With reference to FIG. 3 to FIG. 5, the following describes in detail two encoding methods provided in the embodiments of this application based on a same invention concept.

As shown in FIG. 3, a specific procedure of an encoding method 1 provided in an embodiment of this application is as follows:

Step 301: A transmit end obtains to-be-encoded information.

Step 302: The transmit end performs check encoding to obtain a check encoding codeword.

Step 303: The transmit end performs an interleaving operation on the check encoding codeword.

Step 304: The transmit end performs polar code encoding on a check encoding codeword obtained after the interleaving operation.

Step 305: A receive end obtains a to-be-decoded sequence.

Step 306: The receive end performs polar code decoding on the to-be-decoded sequence.

Step 307: The receive end performs a de-interleaving operation on a decoded sequence.

Alternatively, after step 304, the receive end performs decoding and de-interleaving without performing step 305 to step 307. For example, in a sequential decoding manner, the receive end may check, in a decoding process based on some check bits obtained through decoding, some information bits obtained through decoding. If a check performed on an existing decoding result fails, decoding is stopped immediately, and a decoding failure is fed back; otherwise, decoding continues to be performed.

Specifically, a check encoding method used by the transmit end may be any check encoding method in the prior art, for example, an existing CRC encoding manner. The check encoding codeword obtained by the transmit end through check encoding includes an information bit and a check bit. It is assumed that a length of the information bit is K, and a length of the check bit is J. The transmit end performs the interleaving operation on the check encoding codeword by using an interleaving sequence S. The interleaving sequence S used by the transmit end includes J subsequences, and the J subsequences are concatenated successively. The subsequence includes a position index of an element 1 in an intermediate result vector $T_i$ and a value of (K+i), where $1 \leq i \leq J$, and i is an integer. A subsequence varies with a value of i. Optionally, values of i may be assigned in the following order: an ascending order of values of i; a descending order of values of i; an ascending order of quantities of elements 1 in column vectors $V_i$; or a descending order of quantities of elements 1 in column vectors $V_i$. This is not limited in this application. $T_i = (\sim M) \& (V_i)$ and $M = M | (V_i)$, where M is a masked vector and $V_i$ is a column vector of a checking part matrix P; P is a submatrix of a system-form generator matrix G for check encoding; $\sim$ represents a bit-by-bit NOT operation, & represents a bit-by-bit AND operation, and | represents a bit-by-bit OR operation. Optionally, a masked vector M, the intermediate result vector $T_i$, and the interleaving sequence S are initialized. For example, both the masked vector M and the intermediate result vector $T_i$ are initialized to all-0 vectors with a length of K.

Before step 303, the transmit end may dynamically calculate the foregoing interleaving sequence S, or may perform offline calculation and storage of the interleaving sequence S. In step 303, the transmit end performs the interleaving operation on the check encoding codeword by using the stored interleaving sequence S.

The following describes in detail a manner in which the transmit end calculates the foregoing interleaving sequence S. It should be noted that, the receive end performs offline calculation of the interleaving sequence S in the same calculation manner, and stores the interleaving sequence S.

For ease of description, it is assumed that a length of an information bit is K, and a length of a check bit is J. Briefly, the transmit end calculates a system-form generator matrix G for check encoding, and extracts a checking part matrix P from the generator matrix G; initializes a masked vector M, an intermediate result vector $T_i$, and an interleaving sequence S, for example, initializes both the masked vector M and the intermediate result vector $T_i$ to all-o vectors with a length of K; and reads column vectors $V_i$ of the checking part matrix P column by column in a specified order, where $1 \leq i \leq J$, and i is an integer. Specifically, the transmit end may read the column vectors $V_i$ of the checking part matrix column by column in ascending order of column index values; read the column vectors $V_i$ of the checking part matrix column by column in descending order of column index values; read the column vectors $V_i$ of the checking part matrix column by column in ascending order of quantities of elements 1 in column vectors; or read the column vectors $V_i$ of the checking part matrix column by column in descending order of quantities of elements 1 in column vectors. Certainly, the transmit end may alternatively read the column vectors $V_i$ of P in another specified order. Each time a column vector $V_i$ is read, the following operations are performed once until all column vectors of the checking part matrix P are read: performing calculation of $T_i=(\sim M)\&(V_i)$; recording, at a tail part of S, a position index of an element 1 in $T_i$ and a value of (K+i) sequentially, where i is a column index value of $V_i$ in P; and updating M according to $M=M|(V_i)$, where $\sim$ represents a bit-by-bit NOT operation; & represents a bit-by-bit AND operation; and | represents a bit-by-bit OR operation.

In an example in which check encoding is CRC encoding, the following describes in detail steps used by the transmit end to obtain an interleaving sequence.

(1) Obtain a system-form generator matrix G for CRC encoding based on a CRC polynomial, where G=[I P].

G is a system-form generator matrix with K rows and (K+J) columns, I is an identity matrix with K rows and K columns, and P is a matrix with K rows and J columns. P may be referred to as a checking part matrix, and the checking part matrix P is extracted from G.

(2) Initialize a masked vector M, an intermediate result vector $T_i$, and an interleaving sequence S.

Specifically, the masked vector M and the intermediate result vector $T_i$ are initialized to all-0 vectors with a length of K. A length of the interleaving sequence S is (K+J). During implementation by hardware, the intermediate result vector $T_i$ may occupy a section of address-continuous storage space.

(3) Read column vectors in a matrix P column by column in a specified order.

The column vector is represented by $V_i$, where $1 \leq i \leq J$, and i is an integer. Specifically, the transmit end may read the column vectors sequentially in ascending order or a descending order of column sequence numbers, that is, read column vectors from a first column to a $J^{th}$ column in P sequentially or read column vectors from a $J^{th}$ column to a first column sequentially. The transmit end may alternatively read the column vectors in descending order or ascending order of quantities of elements 1 included in all columns.

Each time a column vector is read, step (3.1) to step (3.3) are performed, until all the column vectors of the checking part matrix P are read.

(3.1) Perform a bit-by-bit operation between a read $i^{th}$ column vector $V_i$ and the masked vector M, and assign an operation result to the vector $T_i$.

For example, calculation of $T_i=(\sim M)\&(V_i)$ is performed, where $\sim$ represents a bit-by-bit NOT operation, and & represents a bit-by-bit AND operation.

(3.2) Read a position index of an element value 1 in the intermediate result vector $T_i$, and record, at a tail part of the interleaving sequence S, the read position index and a value of (K+i), where a recording order may be an ascending order or a descending order of values. This is not limited in this application. The position index may be a sequence number of an element 1 in the intermediate result vector $T_i$, or a difference between an address of an element value 1 in the intermediate result vector $T_i$ and an address of the first element in $T_i$.

(3.3) Update the masked vector M.

The bit-by-bit OR operation is performed between the masked vector M and the vector $V_i$, and the masked vector M is updated by using a value obtained after the operation. For example, calculation of $M=M|(V_i)$ is performed.

(4) Obtain an interleaving sequence S.

For the receive end, in step 307, when a de-interleaving sequence needs to be obtained, the de-interleaving sequence is obtained based on a relationship between a de-interleaving sequence S' and the interleaving sequence S. The relationship between the de-interleaving sequence S' and the interleaving sequence S is S'(S(j))=j, where j takes values from 1 to (K+J) sequentially. The receive end performs a de-interleaving operation on the decoded sequence by using the de-interleaving sequence S'. A method used by the receive end to obtain the interleaving sequence S is the same as that used by the transmit end to obtain the interleaving sequence S. Repeated content is not described herein again. Similarly, before step 307, the receive end may alternatively calculate the de-interleaving sequence S' dynamically, or may perform offline calculation and storage of the de-interleaving sequence S'. In step 307, the receive end performs the de-interleaving operation on the decoded sequence by using the stored de-interleaving sequence S'.

The following uses an example to describe a process of obtaining an interleaving sequence. The example in which check encoding is CRC encoding is still used. For example, a length K of an information bit is 10, and a length J of a check bit of CRC check encoding is 5. A to-be-encoded information vector U is [1, 0, 1, 1, 0, 1, 0, 0, 1, 1], a generator polynomial for CRC encoding is [1 0 1 0 0 1], and a check encoding codeword $C_0$=[1, 0, 1, 1, 0, 1, 0, 0, 1, 1, 1, 0, 1, 0, 0] is obtained in the existing CRC encoding manner.

Therefore, steps used by the transmit end to obtain an interleaving sequence S include steps 1 to 5.

1. Calculate a system-form generator matrix G for CRC encoding, as shown in Table 1. It can be seen that, G is a matrix with K rows and (K+J) columns, that is, G is a 10×(10+5) matrix. G=[I P], where I is an identity matrix with K rows and K columns, that is, I is a 10×10 identity matrix; and P is a matrix with K rows and J columns, that is, P is a 10×5 matrix. P is a checking part matrix.

TABLE 1

| 1 | 0 | 0 | 0 | 0 | 0 | 0 | 0 | 0 | 0 | 0 | 0 | 0 | 1 | 1 |
|---|---|---|---|---|---|---|---|---|---|---|---|---|---|---|
| 0 | 1 | 0 | 0 | 0 | 0 | 0 | 0 | 0 | 0 | 1 | 0 | 1 | 0 | 1 |
| 0 | 0 | 1 | 0 | 0 | 0 | 0 | 0 | 0 | 0 | 1 | 1 | 1 | 1 | 0 |
| 0 | 0 | 0 | 1 | 0 | 0 | 0 | 0 | 0 | 0 | 0 | 1 | 1 | 1 | 1 |
| 0 | 0 | 0 | 0 | 1 | 0 | 0 | 0 | 0 | 0 | 1 | 0 | 0 | 1 | 1 |
| 0 | 0 | 0 | 0 | 0 | 1 | 0 | 0 | 0 | 0 | 1 | 1 | 1 | 0 | 1 |
| 0 | 0 | 0 | 0 | 0 | 0 | 1 | 0 | 0 | 0 | 1 | 1 | 0 | 1 | 0 |
| 0 | 0 | 0 | 0 | 0 | 0 | 0 | 1 | 0 | 0 | 0 | 1 | 1 | 0 | 1 |
| 0 | 0 | 0 | 0 | 0 | 0 | 0 | 0 | 1 | 0 | 1 | 0 | 0 | 1 | 0 |
| 0 | 0 | 0 | 0 | 0 | 0 | 0 | 0 | 0 | 1 | 0 | 1 | 0 | 0 | 1 |

2. Extract the checking part matrix P from G, as shown in Table 2.

TABLE 2

| 0 | 0 | 1 | 1 |   |
|---|---|---|---|---|
| 1 | 0 | 1 | 0 | 1 |
| 1 | 1 | 1 | 1 | 0 |
| 0 | 1 | 1 | 1 | 1 |
| 1 | 0 | 0 | 1 | 1 |
| 1 | 1 | 1 | 0 | 1 |
| 1 | 1 | 0 | 1 | 0 |
| 0 | 1 | 1 | 0 | 1 |
| 1 | 0 | 0 | 1 | 0 |
| 0 | 1 | 0 | 0 | 1 |

3. Initialize a masked vector M to [0, 0, 0, 0, 0, 0, 0, 0, 0, 0], an intermediate result vector $T_i$ to [0, 0, 0, 0, 0, 0, 0, 0, 0, 0], and an interleaving sequence S.

4. Read column vectors $V_i$ of the checking part matrix P column by column, where each time a column is read, a subsequence is obtained through calculation, and the obtained subsequence is recorded at a tail part of the interleaving sequence S.

Specifically, quantities of elements 1 in all the column vectors of the checking part matrix P are determined, that is, [6, 6, 5, 6, 7]. The checking part matrix P is read column by column in ascending order of the quantities of the elements 1 in the column vectors, that is, the column vectors $V_i$ of the checking part matrix P are read column by column in an order of i=[3, 1, 2, 4, 5]. Certainly, an order of reading the column vectors may be determined in another manner.

First, a third column $V_3$ is read, and step 4.1 to step 4.3 are performed.

4.1 Read the third column $V_3$, where $V_3$=[0, 1, 1, 1, 0, 1, 0, 1, 0, 0]; and perform a bit-by-bit operation between $V_3$ and the masked vector M to obtain a vector $T_3$, and $T_3$=(~M) & $(V_i)$=[0, 1, 1, 1, 0, 1, 0, 1, 0, 0].

4.2. Read sequence numbers [2, 3, 4, 6, 8] of elements 1 in $T_3$, and calculate a value of i+K, where (i+K)=(3+10)=13; and record the sequence numbers of the elements 1 in $T_3$ and the value of (i+K) in the interleaving sequence S, for example, record the sequence numbers of the elements 1 in $T_3$ and the value of (i+K) sequentially in the interleaving sequence S in ascending order of values, to obtain S=[2, 3, 4, 6, 8, 13].

4.3. Update the masked vector M. For example, the masked vector M may be updated according to M=M|$(V_i)$, where M=M|$(V_i)$=[0, 1, 1, 1, 0, 1, 0, 1, 0, 0].

Next, the first column, the second column, the fourth column, and the fifth column are read sequentially. Similarly, the interleaving sequence S is updated and recorded according to the foregoing steps. Specifically, reading of the first column, the second column, the fourth column, and the fifth column of the checking part matrix P and change processes of the intermediate result vector $T_i$, the interleaving sequence S, and the masked vector M are as follows: When the first column of the matrix P is read, $T_1$=[0, 0, 0, 0, 1, 0, 1, 0, 1, o], S=[2, 3, 4, 6, 8, 13, 5, 7, 9, 11], and M=[0, 1, 1, 1, 1, 1, 1, 1, 1, 0] are obtained; when the second column of the matrix P is read, $T_2$=[0, 0, 0, 0, 0, 0, 0, 0, 0, 1], S=[2, 3, 4, 6, 8, 13, 5, 7, 9, 11, 10, 12], and M=[0, 1, 1, 1, 1, 1, 1, 1, 1, 1] are obtained; when the fourth column of the matrix P is read, $T_4$=[1, 0, 0, 0, 0, 0, 0, 0, 0, 0], S=[2, 3, 4, 6, 8, 13, 5, 7, 9, 11, 10, 12, 1, 14], and M=[1, 1, 1, 1, 1, 1, 1, 1, 1, 1] are obtained; and when the fifth column of the matrix P is read, $T_5$=[0, 0, 0, 0, 0, 0, 0, 0, 0, 0], S=[2, 3, 4, 6, 8, 13, 5, 7, 9, 11, 10, 12, 1, 14, 15], and M=[1, 1, 1, 1, 1, 1, 1, 1, 1, 1] are obtained.

5. Obtain an interleaving sequence S=[b 2, 3, 4, 6, 8, 13 5, 7, 9, 11, 10, 12, 1, 14, 15].

As shown in FIG. 4, after the interleaving sequence S is obtained, interleaving is performed on the check encoding codeword $C_0$=[1, 0, 1, 1, 0, 1, 9, 0, 1, 1, 1, 0, 1, 0, 0] by using the interleaving sequence S, to obtain a codeword C=[0, 1, 1, 1, 0, 1, 0, 0, 1, 1, 1, 0, 1, 0, 0]. Each element in S represents: an element value whose position index in $C_0$ is the element is set at a position of the element in C. For example, the first element in S is 2, and this indicates that the second element value in $C_0$ is set at the first position in C; and a second element is 3 in S, and this indicates that the third element value in $C_0$ is set at the second position in C.

As shown in FIG. 5, a specific procedure of an encoding method 2 provided in an embodiment of this application is as follows.

Step 501: A transmit end obtains a to-be-encoded information vector U.

Assuming that a length of U is K, a length of a pre-generated check bit is J.

Step 502: The transmit end calculates a system-form generator matrix G for check encoding, and extracts a checking part matrix P from the generator matrix G.

Optionally, a check encoding manner may be CRC encoding, and a system-form generator matrix G for CRC encoding is obtained through the prior art based on a CRC polynomial, where G=[I P]. G is a system-form generator matrix with K rows and (K+J) columns, I is an identity matrix with K rows and K columns, and P is a matrix with K rows and J columns. P may be referred to as a checking part matrix, and the checking part matrix P is extracted from G.

Step 503: The transmit end initializes a masked vector M, a first intermediate result vector $T1_i$, a second intermediate result vector $T2_i$, and a check encoding codeword C.

Specifically, the masked vector M and an intermediate result vector $T_i$ are initialized to all-0 vectors with a length of K. During implementation by hardware, the first intermediate result vector $T1_i$ may occupy a section of address-continuous storage space. A length of the check encoding codeword C is (K+J).

Step 504: The transmit end reads column vectors $V_i$ of the checking part matrix P column by column in a specified order, where 1≤i≤J, and i is an integer. Each time a column vector $V_i$ is read, the following operations are performed until all the column vectors in P are read, to obtain a final check encoding codeword C.

Calculation of $T_i$=(~M)&$(V_i)$ is performed; a bit-by-bit AND operation between U and $V_i$ is performed to obtain $T2_i$; a position index of an element 1 in $T1_i$ is determined, and a result of an exclusive OR operation between an element corresponding to the position index in $T2_i$ and all elements in $T2_i$ is recorded at a tail part of C; and M is updated according to $M=M|(V_i)$, where ~ represents a NOT operation; & represents an AND operation; and | represents an OR operation.

Step 505: The transmit end performs polar encoding on the finally obtained check encoding codeword C.

In step 504, the transmit end may read the column vectors $V_i$ of the checking part matrix P column by column in ascending order of column index values; read the column vectors $V_i$ of the checking part matrix P column by column in descending order of column index values; read the column vectors $V_i$ of the checking part matrix P column by column in ascending order of quantities of elements 1 in column vectors; or read the column vectors $V_i$ of the checking part matrix P column by column in descending order of quantities of elements 1 in column vectors.

The following uses an example to describe the encoding method 2 shown in FIG. 5. An example in which check encoding is CRC encoding is used. For example, a length K of U is 10, and a length J of a check bit of CRC check encoding is 5. U=[1, 0, 1, 1, 0, 1, 0, 0, 1, 1], and a generator polynomial for CRC encoding is [1 0 1 0 0 1]. In this case, steps of obtaining a check encoding codeword C are as follows.

(1) Calculate a system-form generator matrix G for CRC encoding, as shown in Table 3. It can be seen that, G is a matrix with K rows and (K+J) columns, that is, G is a 10×(10+5) matrix. G=[I P], where I is an identity matrix with K rows and K columns, that is, K is a 10×10 identity matrix; and P is a matrix with K rows and J columns, that is, P is a 10×5 matrix. P is a checking part matrix.

TABLE 3

| 1 | 0 | 0 | 0 | 0 | 0 | 0 | 0 | 0 | 0 | 0 | 0 | 0 | 1 | 1 |
| 0 | 1 | 0 | 0 | 0 | 0 | 0 | 0 | 0 | 0 | 1 | 0 | 1 | 0 | 1 |
| 0 | 0 | 1 | 0 | 0 | 0 | 0 | 0 | 0 | 1 | 1 | 1 | 1 | 1 | 0 |
| 0 | 0 | 0 | 1 | 0 | 0 | 0 | 0 | 0 | 0 | 1 | 1 | 1 | 1 | 1 |
| 0 | 0 | 0 | 0 | 1 | 0 | 0 | 0 | 0 | 0 | 1 | 0 | 0 | 1 | 1 |
| 0 | 0 | 0 | 0 | 0 | 1 | 0 | 0 | 0 | 1 | 1 | 1 | 0 | 0 | 1 |
| 0 | 0 | 0 | 0 | 0 | 0 | 1 | 0 | 0 | 1 | 1 | 0 | 1 | 0 | 0 |
| 0 | 0 | 0 | 0 | 0 | 0 | 0 | 1 | 0 | 0 | 1 | 1 | 0 | 1 | 0 |
| 0 | 0 | 0 | 0 | 0 | 0 | 0 | 0 | 1 | 0 | 1 | 0 | 0 | 1 | 0 |
| 0 | 0 | 0 | 0 | 0 | 0 | 0 | 0 | 0 | 1 | 0 | 1 | 0 | 0 | 1 |

(2) Extract the checking part matrix P from G, as shown in Table 4.

TABLE 4

| 0 | 0 | 0 | 1 | 1 |
| 1 | 0 | 1 | 0 | 1 |
| 1 | 1 | 1 | 1 | 0 |
| 0 | 1 | 1 | 1 | 1 |
| 1 | 0 | 0 | 1 | 1 |
| 1 | 1 | 1 | 0 | 1 |
| 1 | 1 | 0 | 1 | 0 |
| 0 | 1 | 1 | 0 | 1 |
| 1 | 0 | 0 | 1 | 0 |
| 0 | 1 | 0 | 0 | 1 |

(3) Initialize a masked vector M to [0, 0, 0, 0, 0, 0, 0, 0, 0, 0], an intermediate result vector $T1_i$ to [0, 0, 0, 0, 0, 0, 0, 0, 0, 0], an intermediate result vector $T2_i$ to [0, 0, 0, 0, 0, 0, 0, 0, 0, 0], and a codeword vector C.

(4) Read column vectors $V_i$ of the checking part matrix P column by column, where each time a column vector $V_i$ is read, an intermediate result vector $T1_i$, an intermediate result vector $T2_i$, a codeword vector C, and a masked vector M are calculated until all column vectors in the checking part matrix P are read.

Specifically, quantities of elements 1 in all the column vectors of the checking part matrix P are determined, that is, [6, 6, 5, 6, 7]. The checking part matrix P is read column by column in ascending order of the quantities of the elements 1 in the column vectors, that is, the column vectors $V_i$ of the checking part matrix P are read column by column in an order of i=[3, 1, 2, 4, 5]. Certainly, an order of reading the column vectors may be determined in another manner.

First, a third column $V_3$ is read, where $V_3$=[0, 1, 1, 1, 0, 1, 0, 1, 0, 0]; and a bit-by-bit operation is performed between $V_3$ and the masked vector M to obtain a vector $T1_3$, where $T1_3$=(~M)&($V_i$)=[0, 1, 1, 1, 0, 1, 0, 1, 0, 0].

Next, a bit-by-bit AND operation is performed between U and $V_3$ to obtain $T2_3$, where, $T2_3$=[0, 0, 1, 1, 0, 1, 0, 0, 0, 0].

Then, a sequence number vector [2, 3, 5, 6, 7, 8] of element values 1 in $T1_3$ is determined, element values [0, 1, 1, 1, 0] corresponding to these sequence numbers in $T2_3$ are extracted, an exclusive OR result [1] of all bits of $T2_3$ is determined, these element values [0, 1, 1, 1, 0] extracted from $T2_3$ and the foregoing exclusive OR result [1] are added to the codeword vector C sequentially, to obtain C=[0, 1, 1, 1, 0, 1].

Finally, the masked vector M is updated, for example, the masked vector M may be updated according to $M=M|(V_i)$, where $M=M|(V_i)$=[0, 1, 1, 1, 0, 1, 0, 1, 0, 0].

Reading of the first column, the second column, the fourth column, and the fifth column of the checking part matrix P and change processes of the intermediate result vector $T_i$, the intermediate result vector $T2_i$, the codeword vector C, and the masked vector M are as follows:

When the first column of the matrix P is read, $T1_1$=[0, 0, 0, 0, 1, 0, 1, 0, 1, 0], $T2_1$=[0, 0, 1, 0, 0, 1, 0, 0, 1, 0], C=[0, 1, 1, 1, 0, 1, 0, 0, 1, 1], and M=[0, 1, 1, 1, 1, 1, 1, 1, 1, 0] are obtained; when the second column of the matrix P is read, $T1_2$=[0, 0, 0, 0, 0, 0, 0, 0, 0, 1], $T2_2$=[0, 0, 1, 1, 0, 1, 0, 0, 0, 1], C=[0, 1, 1, 1, 0, 1, 0, 0, 1, 1, 1, 0], and M=[0, 1, 1, 1, 1, 1, 1, 1, 1, 1] are obtained; when the fourth column of the matrix P is read, $T1_4$=[1, 0, 0, 0, 0, 0, 0, 0, 0, 0], $T2_4$=[1, 0, 1, 1, 0, 0, 0, 0, 1, 0], C=[0, 1, 1, 1, 0, 1, 0, 0, 1, 1, 1, 0, 1, 0], and M=[1, 1, 1, 1, 1, 1, 1, 1, 1, 1] are obtained; and when the fifth column of the matrix P is read, $T1_5$=[0, 0, 0, 0, 0, 0, 0, 0, 0, 0], $T2_5$=[1, 0, 0, 1, 0, 1, 0, 0, 0, 1], C=[0, 1, 1, 1, 0, 1, 0, 0, 1, 1, 1, 0, 1, 0, 0], and M=[1, 1, 1, 1, 1, 1, 1, 1, 1, 1] are obtained.

(5) Obtain a check encoding codeword C=[0, 1, 1, 1, 0, 1, 0, 0, 1, 1, 1, 0, 1, 0, 0].

According to the foregoing encoding methods shown in FIG. 3 and FIG. 5, in the embodiments of this application, interleaving of a check encoding codeword can be implemented, to intersperse a check bit between information bits. When the receive end performs sequential decoding, each time a check bit is obtained through decoding, a check can be performed based on the decoded check bit, and if the check fails, decoding may end in advance, helping to avoid a problem of a waste of decoding resources caused because a check is performed after channel decoding ends, to shorten decoding duration and improve decoding efficiency. In addition, according to the methods provided in the embodiments of this application, it can be simpler to implement interleaving of a check encoding codeword, effectively reducing hardware overheads, and helping to increase encoding resource utilization.

Figure 6:
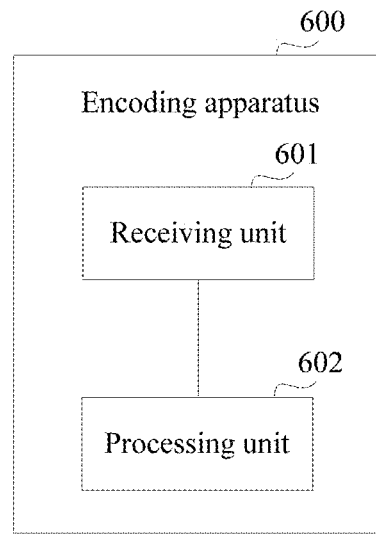
FIG. 6 is a schematic structural diagram 1 of an encoding apparatus according to an embodiment of this application.

According to an invention concept the same as that of the encoding method shown in FIG. 3 or FIG. 5, as shown in FIG. 6, an embodiment of this application further provides an encoding apparatus 600. The encoding apparatus 600 is configured to perform the encoding method shown in FIG.

3 or FIG. 5, and the encoding apparatus 600 includes: a receiving unit 601, configured to obtain to-be-encoded information; and a processing unit 602, configured to perform check encoding on the to-be-encoded information to obtain a check encoding codeword, where the check encoding codeword includes an information bit and a check bit, a length of the information bit is K, and a length of the check bit is J.

The processing unit 602 is further configured to perform an interleaving operation on the check encoding codeword. An interleaving sequence S used in the interleaving operation includes J subsequences, and an $i^{th}$ subsequence includes a position index of an element 1 in an intermediate result vector $T_i$ and a value of (K+i), where $1 \leq i \leq J$, i is an integer, $T_i = (\sim M) \& (V_i)$, $M = M | (V_i)$, M is a masked vector, $V_i$ is a column vector of a checking part matrix P, P is a submatrix of a system-form generator matrix G for check encoding, $\sim$ represents a bit-by-bit NOT operation, & represents a bit-by-bit AND operation, and | represents a bit-by-bit OR operation.

The processing unit 602 is further configured to perform polar encoding on a check encoding codeword obtained after the interleaving operation.

Optionally, the processing unit 602 is configured to: before performing the interleaving operation on the check encoding codeword, calculate the interleaving sequence S, or perform offline calculation and storage of the interleaving sequence S; and perform the interleaving operation on the check encoding codeword based on the stored interleaving sequence S.

Optionally, values of i in the J subsequences are assigned in the following order: an ascending order of values of i; a descending order of values of i; an ascending order of quantities of elements 1 in column vectors $V_i$; or a descending order of quantities of elements 1 in column vectors $V_i$.

Figure 7:
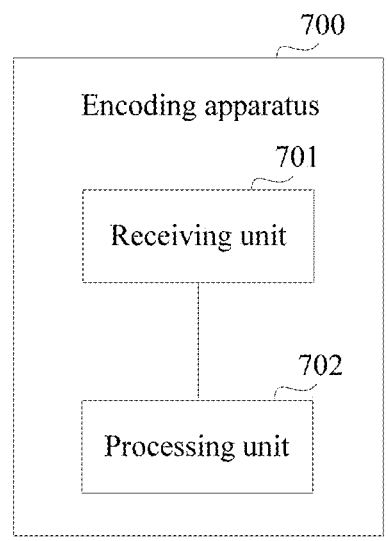
FIG. 7 is a schematic structural diagram 2 of an encoding apparatus according to an embodiment of this application.

According to an invention concept the same as that of the encoding method shown in FIG. 3 or FIG. 5, as shown in FIG. 7, an embodiment of this application further provides an encoding apparatus 700. The encoding apparatus 700 is configured to perform the encoding method shown in FIG. 3 or FIG. 5, and the encoding apparatus 700 includes: a receiving unit 701, configured to obtain a to-be-encoded information vector U; and a processing unit 702, configured to: calculate a system-form generator matrix G for check encoding, and extract a checking part matrix P from G.

The processing unit 702 is further configured to initialize a masked vector M, a first intermediate result vector $T1_i$, a second intermediate result vector $T2_i$, and a check encoding codeword C.

The processing unit 702 is further configured to read column vectors $V_i$ of the checking part matrix P column by column in a specified order. Each time a column vector $V_i$ is read, the following operations are performed: performing calculation of $T1_i = (\sim M) \& (V_i)$; performing a bit-by-bit AND operation between U and $V_i$ to obtain $T2_i$; determining a position index of an element 1 in T1, recording, at a tail part of C, a result of an exclusive OR operation between an element corresponding to the position index in $T2_i$ and all elements in $T2_i$; and updating M according to $M = M | (V_i)$, where $\sim$ represents a bit-by-bit NOT operation; & represents a bit-by-bit AND operation; and | represents a bit-by-bit OR operation.

The processing unit 702 is further configured to perform polar encoding on the check encoding codeword C.

Optionally, the processing unit 702 is configured to: read the column vectors $V_i$ of the checking part matrix column by column in ascending order of column index values; read the column vectors $V_i$ of the checking part matrix column by column in descending order of column index values; read the column vectors $V_i$ of the checking part matrix column by column in ascending order of quantities of elements 1 in column vectors; or read the column vectors $V_i$ of the checking part matrix column by column in descending order of quantities of elements 1 in column vectors.

Figure 8:
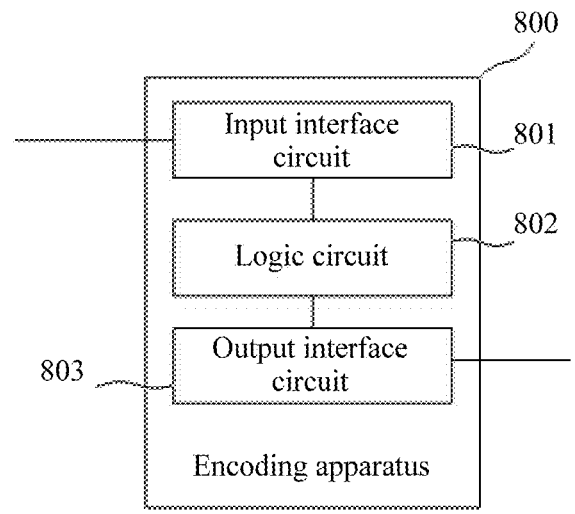
FIG. 8 is a schematic structural diagram 3 of an encoding apparatus according to an embodiment of this application.

According to an invention concept the same as that of the encoding method shown in FIG. 3 or FIG. 5, as shown in FIG. 8, an embodiment of this application further provides an encoding apparatus 800. The encoding apparatus 800o is configured to perform the encoding method shown in FIG. 3 or FIG. 5. Some or all steps of the encoding methods in the foregoing embodiments may be implemented by hardware or software. When some or all steps of the encoding methods are implemented by hardware, the encoding apparatus 800 includes: an input interface circuit 801, configured to obtain to-be-encoded information; a logic circuit 802, configured to perform the encoding method shown in FIG. 3 or FIG. 5, where for details, refer to the descriptions in the foregoing method embodiments, and the details are not described herein again; and an output interface circuit 803, configured to output a bit sequence obtained after polar encoding.

Optionally, the encoding apparatus 800 may be a chip or an integrated circuit in specific implementation.

Figure 9:
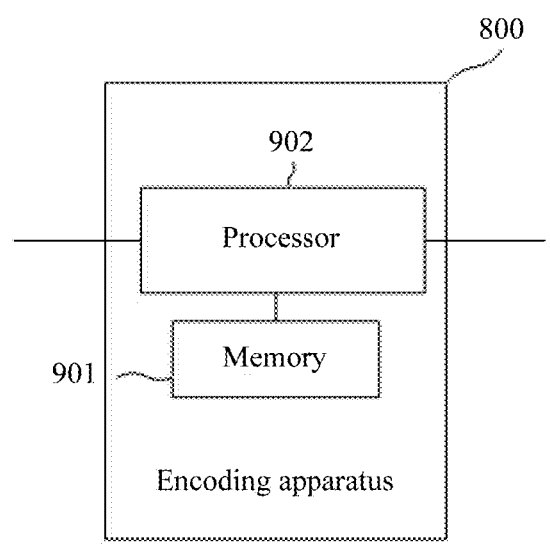
FIG. 9 is a schematic structural diagram 4 of an encoding apparatus according to an embodiment of this application.

Optionally, when some or all steps of the encoding methods in the foregoing embodiments are implemented by software, as shown in FIG. 9, the encoding apparatus 800 includes: a memory 901, configured to store a program; and a processor 902, configured to execute the program stored in the memory 901, where when the program is executed, the encoding apparatus 800 is enabled to implement the encoding methods provided in the foregoing embodiments.

Figure 10:
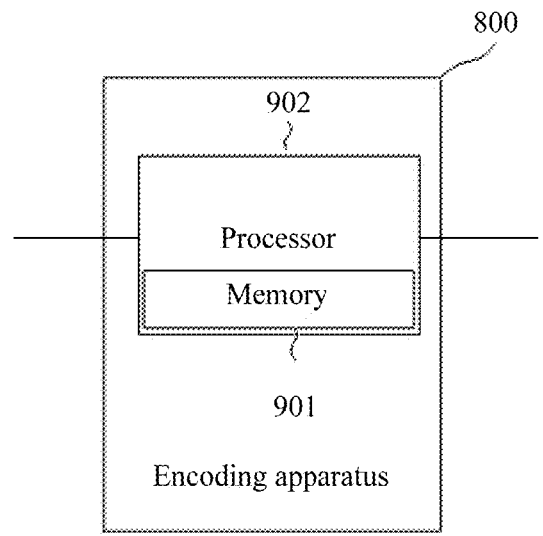
FIG. 10 is a schematic structural diagram 5 of an encoding apparatus according to an embodiment of this application.

Optionally, the memory 901 may be a physically independent unit. Alternatively, as shown in FIG. 10, the memory 901 is integrated together with the processor 902.

Optionally, when some or all steps of the encoding methods in the foregoing embodiments are implemented by software, the encoding apparatus 800 may alternatively include only a processor 902. A memory 901 configured to store a program is located outside the encoding apparatus 800. The processor 902 is connected to the memory 901 through a circuit/an electric wire, and is configured to read and execute the program stored in the memory 901.

Figure 11:
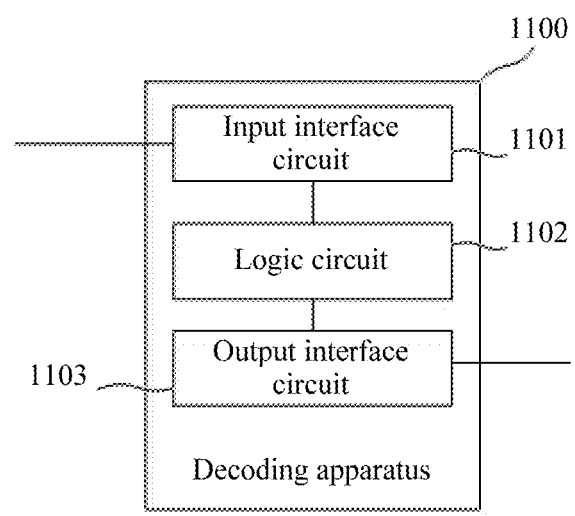
FIG. 11 is a schematic structural diagram 1 of a decoding apparatus according to an embodiment of this application.

According to an invention concept the same as that of a method, performed by the receive end, in the method shown in FIG. 3, as shown in FIG. 11, an embodiment of this application further provides a decoding apparatus 1100, and the decoding apparatus 1100 is configured to perform the method, performed by the receive end, in the method shown in FIG. 3. Some or all steps of the method, performed by the receive end, in the method shown in FIG. 3 may be implemented by hardware or software. When some or all steps of the method, performed by the receive end, in the method shown in FIG. 3 are implemented by hardware, the decoding apparatus 1100 includes: an input interface circuit 1101, configured to obtain a to-be-decoded sequence; a logic circuit 1102, configured to perform the method, performed by the receive end, in the method shown in FIG. 3, where for details, refer to the descriptions in the foregoing method embodiment, and the details are not described herein again; and an output interface circuit 1103, configured to output a bit sequence obtained after a de-interleaving operation.

Optionally, the decoding apparatus 1100 may be a chip or an integrated circuit in specific implementation.

Figure 12:
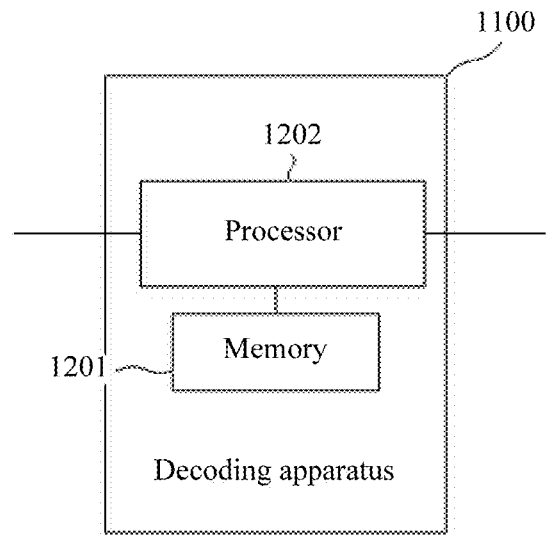
FIG. 12 is a schematic structural diagram 2 of a decoding apparatus according to an embodiment of this application.

Optionally, when some or all steps of the method, performed by the receive end, in the method shown in FIG. 3 are implemented by software, as shown in FIG. 12, the decoding apparatus 1100 includes: a memory 1201, configured to store a program; and a processor 1202, configured to execute the program stored in the memory 1201. When the program is executed, the decoding apparatus 1100 is enabled to implement the method, performed by the receive end, in the method shown in FIG. 3.

Figure 13:
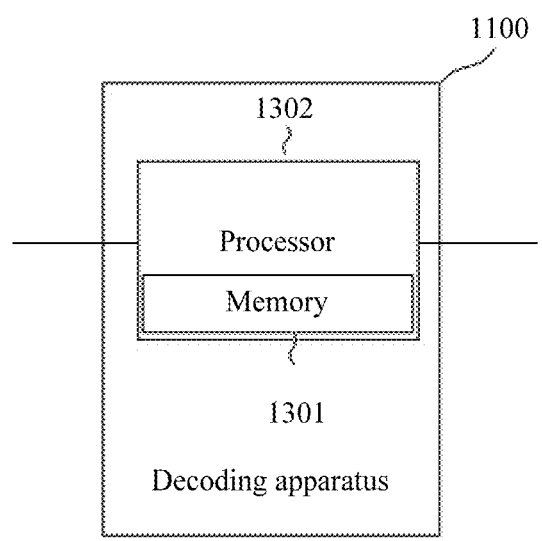
FIG. 13 is a schematic structural diagram 3 of a decoding apparatus according to an embodiment of this application.

Optionally, the memory 1201 may be a physically independent unit. Alternatively, as shown in FIG. 13, a memory 1301 is integrated together with a processor 1302.

Optionally, when some or all steps of the method, performed by the receive end, in the method shown in FIG. 3 are implemented by software, the decoding apparatus 1100 may alternatively include a processor 1202. A memory 1201 configured to store a program is located outside the decoding apparatus 1100. The processor 1202 is connected to the memory 1201 through a circuit/an electric wire, and is configured to read and execute the program stored in the memory 1201.

An embodiment of this application provides a computer storage medium, configured to store a computer program, where the computer program is used to perform the encoding method shown in FIG. 3 or FIG. 5.

An embodiment of this application provides a computer program product including an instruction, where when the computer program product runs on a computer, the computer is enabled to perform the encoding method shown in FIG. 3 or FIG. 5.

In the embodiments of this application, the encoding apparatuses shown in FIG. 8 to FIG. 10 each may alternatively be a system on chip, and the decoding apparatuses shown in FIG. 11 to FIG. 13 each may alternatively be a system on chip.

Persons skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps of implementing a specific function in one or more processes in the flowcharts and/or in one or more blocks in the block diagrams.

Although some embodiments of this application have been described, persons skilled in the art can make changes and modifications to these embodiments once they learn the basic invention concept. Therefore, the appended claims are used to be construed as to cover the preferred embodiments and all changes and modifications falling within the scope of this application.

Obviously, persons skilled in the art can make various modifications and variations to the embodiments of this application without departing from the scope of the embodiments of this application. The embodiments of this application are intended to cover these modifications and variations provided that they fall within the scope of the claims of this application and their equivalent technologies.

What is claimed is:

1. A method, comprising:
performing, by a transmit end, check encoding on to-be-encoded information to obtain a check encoding codeword, wherein the check encoding codeword comprises at least one information bit and at least one check bit, a length of the at least one information bit is K, and a length of the at least one check bit is J;
performing, by the transmit end, an interleaving operation on the check encoding codeword to obtain an interleaved check encoding codeword,
wherein an interleaving sequence S used in the interleaving operation comprises J subsequences,
wherein an i-th subsequence of the J subsequences comprises a position index of a position of an element 1 in an intermediate result vector Ti and a value of (K+i), and
wherein $1 \leq i \leq J$, i is an integer, the intermediate result vector Ti=($\sim$M)&(Vi), M=M|(Vi), M is a masked vector, Vi is a column vector of a checking part matrix P with K rows and J columns, P is a submatrix of a system-form generator matrix G for the check encoding, G=[I P] with K rows and (K+J) columns, I is an identity matrix with K rows and K columns, $\sim$ represents a bit-by-bit NOT operation, & represents a bit-by-bit AND operation, and | represents a bit-by-bit OR operation; and
performing, by the transmit end, polar encoding on the interleaved check encoding codeword obtained after the interleaving operation.

2. The method according to claim 1, further comprising:
before the performing the interleaving operation on the check encoding codeword:
calculating the interleaving sequence S; or
performing, by the transmit end, offline calculation of the interleaving sequence S and storing, by the transmit end, the interleaving sequence S, wherein the performing the interleaving operation on the check encoding codeword comprises: performing, by the transmit end, the interleaving operation on the check encoding codeword based on the stored interleaving sequence S.

3. The method according to claim 1, wherein values of i in the J subsequences are assigned in one of:
an ascending order of the values of i,
a descending order of the values of i,
an ascending order of quantities of elements 1 in the column vector Vi, or
a descending order of quantities of elements 1 in the column vector Vi.

4. The method according to claim 1, wherein the check encoding is a cyclic redundancy check (CRC) encoding.

5. The method according to claim 4, wherein a number of CRC bits is 5.

6. The method according to claim 5, wherein a generator polynomial for the CRC encoding is [1 0 1 0 0 1].

7. An apparatus, comprising:
a non-transitory memory configured to store a program instruction; and
a processor configured to access the program instruction, wherein the processor executes the program instruction to:
obtain to-be-encoded information;
perform check encoding on the to-be-encoded information to obtain a check encoding codeword, wherein the check encoding codeword comprises at least one information bit and at least one check bit, a length of the at least one information bit is K, and a length of the at least one check bit is J;
perform an interleaving operation on the check encoding codeword to obtain an interleaved check encoding codeword; and
perform polar encoding on the interleaved check encoding codeword obtained after the interleaving operation,
wherein an interleaving sequence S used in the interleaving operation comprises J subsequences,
wherein an i-th subsequence of the J subsequences comprises a position index of a position of an element 1 in an intermediate result vector Ti and a value of (K+i), and
wherein $1 \leq i \leq J$, i is an integer, the intermediate result vector Ti=(~M)&(Vi), M=M|(Vi), M is a masked vector, Vi is a column vector of a checking part matrix P with K rows and J columns, P is a submatrix of a system-form generator matrix G for the check encoding, G=[I P] with K rows and (K+J) columns, I is an identity matrix with K rows and K columns, ~ represents a bit-by-bit NOT operation, & represents a bit-by-bit AND operation, and | represents a bit-by-bit OR operation.

8. The apparatus according to claim 7, wherein the processor executes the program instruction further to:
before performing the interleaving operation on the check encoding codeword:
calculate the interleaving sequence S; or
perform offline calculation and store the interleaving sequence S, and perform the interleaving operation on the check encoding codeword based on the stored interleaving sequence S.

9. The apparatus according to claim 7, wherein values of i in the J subsequences are assigned in one of:
an ascending order of the values of i;
a descending order of the values of i;
an ascending order of quantities of elements 1 in the column vector Vi; or
a descending order of quantities of elements 1 in the column vector Vi.

10. The apparatus according to claim 7, wherein the check encoding is a cyclic redundancy check (CRC) encoding.

11. The apparatus according to claim 10, wherein a number of CRC bits is 5.

12. The apparatus according to claim 11, wherein a generator polynomial for the CRC encoding is [1 0 1 0 0 1].

13. The apparatus according to claim 7, wherein the apparatus is a chip.

14. A computer readable storage medium, wherein the computer readable storage medium stores computer readable instructions, and when run in an apparatus, the computer readable instructions cause the apparatus to perform operations, the operations comprising:
obtaining to-be-encoded information;
performing check encoding on the to-be-encoded information to obtain a check encoding codeword, wherein the check encoding codeword comprises at least one information bit and at least one check bit, a length of the at least one information bit is K, and a length of the at least one check bit is J;
performing an interleaving operation on the check encoding codeword to obtain an interleaved check encoding codeword; and
performing polar encoding on the interleaved check encoding codeword obtained after the interleaving operation,
wherein an interleaving sequence S used in the interleaving operation comprises J subsequences,
wherein an i-th subsequence of the J subsequences comprises a position index of a position of an element 1 in an intermediate result vector Ti and a value of (K+i), and
wherein $1 \leq i \leq J$, i is an integer, the intermediate result vector Ti=(~M)&(Vi), M=M|(Vi), M is a masked vector, Vi is a column vector of a checking part matrix P with K rows and J columns, P is a submatrix of a system-form generator matrix G for the check encoding, G=[I P] with K rows and (K+J) columns, I is an identity matrix with K rows and K columns, ~ represents a bit-by-bit NOT operation, & represents a bit-by-bit AND operation, and | represents a bit-by-bit OR operation.

15. The computer readable storage medium according to claim 14, wherein to the operations further comprise:
before the performing the interleaving operation on the check encoding codeword:
calculating the interleaving sequence S; or
performing offline calculation and store the interleaving sequence S, and performing the interleaving operation on the check encoding codeword based on the stored interleaving sequence S.

16. The computer readable storage medium according to claim 14, wherein values of i in the J subsequences are assigned in one of:
an ascending order of the values of i,
a descending order of the values of i,
an ascending order of quantities of elements 1 in the column vector Vi, or
a descending order of quantities of elements 1 in the column vector Vi.

17. The computer readable storage medium according to claim 14, wherein the check encoding is a cyclic redundancy check (CRC) encoding.

18. The computer readable storage medium according to claim 17, wherein a number of CRC bits is 5.

19. The computer readable storage medium according to claim 18, wherein a generator polynomial for the CRC encoding is [1 0 1 0 0 1].

20. The computer readable storage medium according to claim 19, wherein K is 10.

* * * * *